United States Patent
Ganev et al.

(10) Patent No.: US 7,898,827 B2
(45) Date of Patent: Mar. 1, 2011

(54) ACTIVE EMI FILTERING USING MAGNETIC COUPLING CANCELLATION

(75) Inventors: Evgeni Ganev, Torrance, CA (US); William Warr, Glendale, CA (US)

(73) Assignee: Honeywell International Inc., Morristown, NJ (US)

( * ) Notice: Subject to any disclaimer, the term of this patent is extended or adjusted under 35 U.S.C. 154(b) by 378 days.

(21) Appl. No.: 12/125,281

(22) Filed: May 22, 2008

(65) Prior Publication Data
US 2009/0290392 A1 Nov. 26, 2009

(51) Int. Cl.
*H02J 1/02* (2006.01)
(52) U.S. Cl. .................. 363/39; 363/43; 363/45; 363/46; 363/47
(58) Field of Classification Search .................. 327/552, 327/553; 363/39, 43, 45, 46, 47
See application file for complete search history.

(56) References Cited

U.S. PATENT DOCUMENTS

| | | | |
|---|---|---|---|
| 5,726,504 A * | 3/1998 | Pecukonis et al. | 307/105 |
| 6,434,029 B1 * | 8/2002 | Cyr et al. | 363/86 |
| 6,775,157 B2 | 8/2004 | Honda | |
| 6,839,250 B2 | 1/2005 | Takahashi et al. | |
| 6,898,092 B2 | 5/2005 | Briere et al. | |
| 7,061,195 B2 | 6/2006 | Ho et al. | |
| 2004/0141275 A1 | 7/2004 | Athari | |
| 2005/0099826 A1 * | 5/2005 | Yasumura | 363/16 |
| 2008/0024951 A1 * | 1/2008 | Mortensen et al. | 361/118 |
| 2009/0128273 A1 * | 5/2009 | Huss et al. | 336/61 |

* cited by examiner

*Primary Examiner* — Bao Q Vu
*Assistant Examiner* — Nguyen Tran
(74) *Attorney, Agent, or Firm* — Oral Caglar, Esq.

(57) ABSTRACT

An active electromagnetic interference (EMI) filtering may reduce the requirements for high current differential mode inductors. The active EMI filtering of the present invention may be useful in power devices that use switching power converters. Conventional EMI differential mode filtering devices may occupy up to 30% of the total weight and volume of the power electronics. Conventional differential mode filtering inductors tend to be large and heavy, especially so for high current input power lines. The present invention may replace the large conventional differential mode filtering inductors with a smaller set of coupled inductors.

15 Claims, 9 Drawing Sheets

ACTIVE EMI FILTERING USING MAGNETIC COUPLING CANCELLATION

BACKGROUND OF THE INVENTION

The present invention relates to electromagnetic interference (EMI) filtering apparatus and methods and, more particularly, to active EMI power line filtering for power devices using switching converters.

Traditional passive input power line EMI filters utilize series inductors and shunt capacitors to provide the filtering action which reduces the flow of interference currents from a source within the equipment of concern back onto the power bus providing power to that equipment. The inductors may be single winding, to predominantly reduce differential mode currents, or wound with multiple conductors to predominantly reduce either differential mode or common mode interference, depending upon the connections of the windings. If the windings on a multiple winding inductor are connected in such a way that the power frequency flux contribution from each winding is additive, then net differential mode inductance is present, and higher frequency differential mode current will be attenuated. If the windings on a multiple winding inductor are connected in such a way that the power frequency flux contributions from the windings are opposing, and tend to cancel, then differential mode inductance will be absent, but common mode inductance will be present. EMI power line filter inductors should be designed to attenuate the type(s) of interference, differential mode or common mode, which are present.

The capacitors in a traditional passive power line filter may be connected line-to-line, to reduce the amplitude of differential mode currents flowing back onto the input power bus, or line-to-ground, to reduce the common mode interference current. The capacitors should be connected to treat the type of interference present.

Power conversion equipment utilizing switching converters generally produces harmonics of the switching frequency which are impressed upon the input power leads. The purpose of input power line filtering is to reduce the level of these harmonics to an acceptable level, such as imposed by MIL-STD-461E (Military Standard Specification) or DO-160E (Radio Technical Commission for Aeronautics, RTCA standard). Depending upon the EMI specification imposed, either the voltage harmonics or current harmonics may be measured. There may also be power line contamination from rectifier noise, and from the harmonics of clock frequencies used by digital circuits. The proper EMI filter for a given application will include appropriate levels of both differential mode and common mode filtering, over the respectively required frequency ranges, to meet EMI specification requirements with an adequate safety margin.

Inductors for differential mode filtering are typically on the order of 10 to 500 microhenries. Inductance component values generally decrease as inductor current rating increases. These inductors allow the power frequency (e.g., DC, 50 Hz, 60 Hz, 400 Hz, or variable frequencies from 360 Hz to 800 Hz) to pass unimpeded, and perform as high series impedances at higher frequencies. At the power frequency, a good practice is to limit the total filter inductor differential mode inductive reactance to one percent of the magnitude of the filter load impedance. For the filter inductor to present a relatively high series impedance to high frequencies, it is important to control the inductor parasitic winding capacitance. This capacitance, which represents the net effect of the turn-to-turn capacitance and the capacitance from inductor input lead to output lead, is generally on the scale of tens of picofarads. The intentional inductance and unintentional parasitic capacitance will form a parallel resonant circuit. Below resonance, the inductor performs as an inductor. Above the resonant frequency, the inductor performs as a series capacitor. Inductor saturation is also a concern; an excessive number of ampere-turns on a given core will cause the effective permeability to decrease, resulting in less than desired effective inductance.

Differential mode filter capacitors are generally on the order of 1 to 50 microfarads. These capacitors present a high impedance to the power frequency and other very low frequencies, but present a low impedance to much higher frequencies. As a general guideline, to prevent untoward power frequency effects, the capacitive reactance at the power frequency due the total effective differential mode capacitance should be at least one hundred times the impedance magnitude of the filter load. The low shunt impedance due to the differential mode capacitance serves to return differential mode interference current found on one input power lead to the interference source, via a companion power lead. For these differential mode shunt capacitors to work, the capacitors must display a low impedance at the interference frequency of concern. Tending to spoil (i.e., increase) this low impedance is the unintentional stray inductance due to capacitor construction or capacitor lead length (generally on the order of 25 nanohenries per inch of total lead length). This inductance forms a series resonant circuit with the capacitance. Below resonance, the capacitor acts as a capacitor, with decreasing impedance magnitude with increasing frequency. Above resonance, the capacitor acts like an inductor, with increasing impedance magnitude as frequency increases. A properly designed and installed differential mode capacitor will display insignificant stray inductance over its frequency range of concern.

The predominant shortcomings of passive filter elements are summarized below, to provide insight for desirable components to possibly replace with active filter circuits:

Differential mode inductors—Tend to be large and heavy, especially for high current input power lines. Tend to have rather low self-resonant frequencies (lower than 5 MHz);

Differential mode capacitors—Size may become a problem for higher voltage input power lines. Tend to work best at lower frequencies (lower than 5 MHz) due to lead length inductance;

Common mode inductors—Size may become a problem for high current power lines. Tend to work best at lower frequencies due to low self-resonance (lower than 5 MHz); and Common mode capacitors—Are generally very small components, and can be very effective higher frequency filters (higher than 10 MHz). Performance is limited, especially at lower frequencies, due to personnel safety limits on capacitor value. Increased high frequency performance can be gained by using surface mount (better) or feedthrough (best) configuration. Feedthrough configuration can increase volume required, and complicate manufacturing somewhat.

The EMI related devices and provisions as a part of a power electronics equipment may occupy up to 30% of the total weight and volume. Therefore, there is a need in the modern power electronics aerospace industry for new approaches for improved performance while occupying less total weight and volume as compared to conventional passive filters.

SUMMARY OF THE INVENTION

In one aspect of the present invention, a circuit for filtering a power signal comprises an inductor having a first winding and a second winding; and a current sensor block sensing an interference current in the power signal; the second winding for adding a cancellation signal, based on the sensed interference current, back into the power signal to cancel the interference current from the power supply.

In another aspect of the present invention, there is described a power converter producing harmonics impressed on a power signal, the power converter comprising an active differential mode filter, and the filter comprises a first and second coil wound on a common core, wherein the first coil acts as a passive differential mode filter and a current sensor block sensing the harmonics as an interference current on the power signal; and the second coil adds a cancellation signal, based on the interference current, back into the power signal to cancel the harmonics from the power supply.

In a further aspect of the present invention, a method for reducing interference harmonics from a power supply comprises passing the power signal through an active differential mode filter, wherein the filter has a first and second coil; sensing the interference harmonics with a sensing device; and canceling the interference harmonics in the power signal by delivering a phase-shifted interference signal to the power signal.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention provides active electromagnetic interference (EMI) filtering that may reduce the requirements for high current differential mode inductors. The active EMI filtering of the present invention may be useful in power devices that use switching power converters. For example, the aerospace industry may use switching power converters for converting between alternating current (AC) and direct current (DC).

Conventional EMI differential mode filtering devices may occupy up to 30% of the total weight and volume of the power electronics. Conventional differential mode filtering inductors tend to be large and heavy, especially so for high current input power lines. The present invention may replace the large conventional differential mode filtering inductors with a smaller set of coupled inductors, as described in greater detail below.

Active filtering, according to the present invention, may be installed to act as high series impedance elements to reduce the requirements for high current differential mode inductors. For direct replacement of differential mode inductors, the active filter would need to operate at the same current and voltage levels experienced by those being replaced. In one embodiment of the present invention, the active circuitry has a secondary winding on an otherwise normal differential mode inductor, whereby the interference current sensed by a sensor would provide information to a relatively wideband amplifier. The amplifier may then function to amplify that interference signal and apply that amplified signal, out of phase, back to the secondary winding, serving to cancel the originally sensed interference signal.

The sensor/feedback circuit may need to operate over the full expected differential mode interference frequency range to be fully effective. To have an effective ampere turns advantage with respect to the power current carrying winding of the differential mode inductor (in other words, to reduce the output power requirements of the wideband interference canceling amplifier), the secondary winding may have more turns than a conventional differential mode inductor. For a two wire power system, either two separate differential mode inductors could be used, or, with proper phasing, a single differential mode inductor having proper phasing of the two main power current windings could be used to provide additive interference magnetic flux within the magnetic core, thereby allowing differential mode inductance and differential mode filtering.

The active differential mode system of the present invention, as described in greater detail below, having an active interference canceling scheme, may be fully effective in a substantial portion of the requirement range for significant differential mode interference of 10 kilohertz (kHz) to 5 megahertz (MHz). This active interference canceling scheme thus may significantly reduce the gross values of the otherwise required (in conventional systems) differential mode inductors and capacitors, resulting in a reduced overall converter package volume and weight.

Using Multisim 6 (tm) circuit analysis software, it was decided to initially explore replacing a relatively large value differential mode inductor with a smaller inductor value, but with the inductor including a separate winding for operational amplifier feedback and active filter "interference correction". The Comparative Examples 1 and 2 and the Example 1 below show the results that may be obtained with conventional differential mode filter as compared with differential mode filtering according to the present invention.

COMPARATIVE EXAMPLE 1

Figure 1:
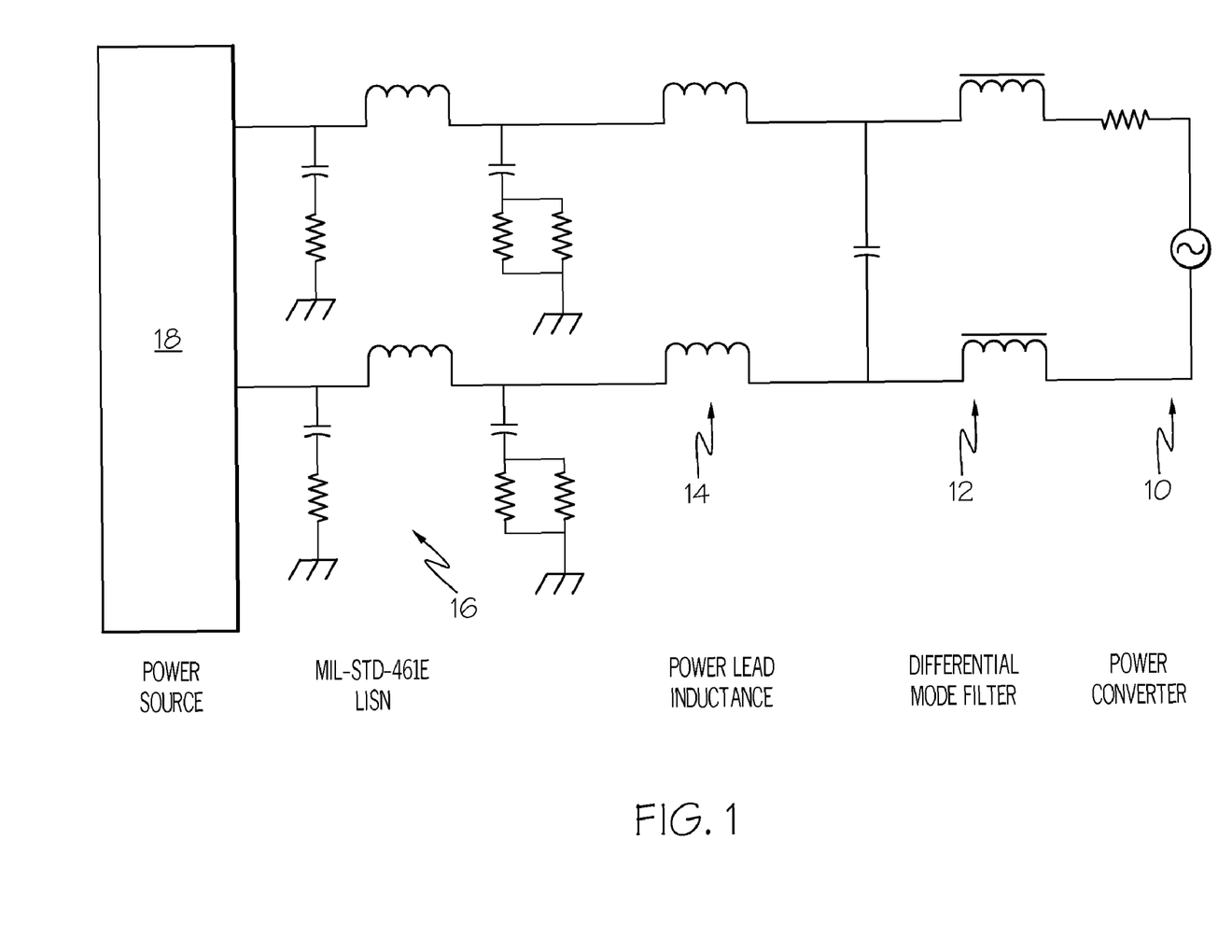
FIG. 1 is a schematic drawing of a circuit used for simulation of passive differential made power line filtering according to a comparative example of the present invention.

Referring to FIG. 1, the source of the interference in the modeling is an example power conversion device 10. A differential mode EMI filter 12 is then shown to the left of the interference source 10 (also referred to as the power conversion device 10), followed to its left by the expected 2 microhenry (μH) inductance of each 2-meter long input power lead 14, and, to its left, the MIL-STD-461E test setup line impedance stabilization network ("LISN") 16 in each power lead delivered from a power supply 18. The LISNs represent standardized power source impedances for EMI testing purposes.

Figure 2:
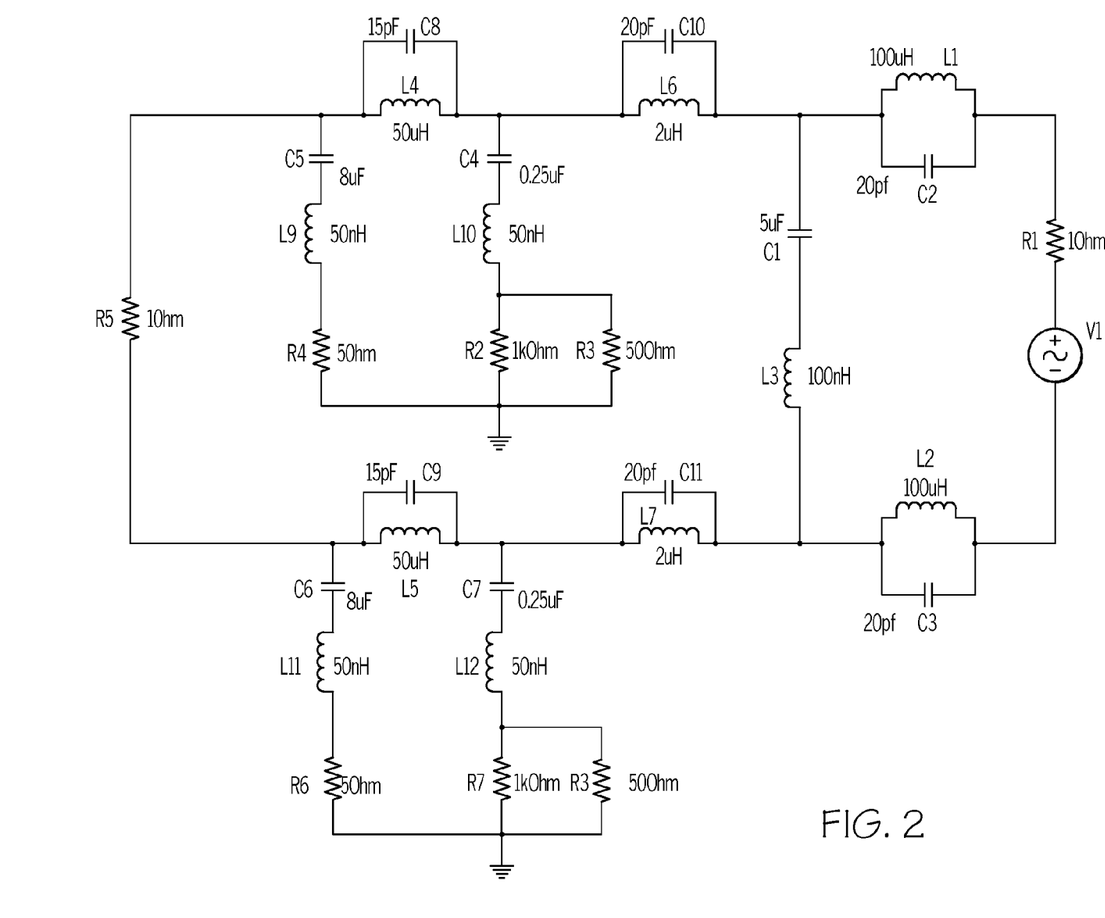
FIG. 2 is a schematic drawing of a circuit used for simulation of passive differential made power line filtering, showing nominal expected component parasitic capacitances and inductances, according to a comparative example of the present invention.

Referring to FIG. 2, there are shown typical stray reactances included for the components of the EMI filter 12, the power leads 14, and the two LISNs 16 for the example two power lead circuit of FIG. 1.

Figure 3:
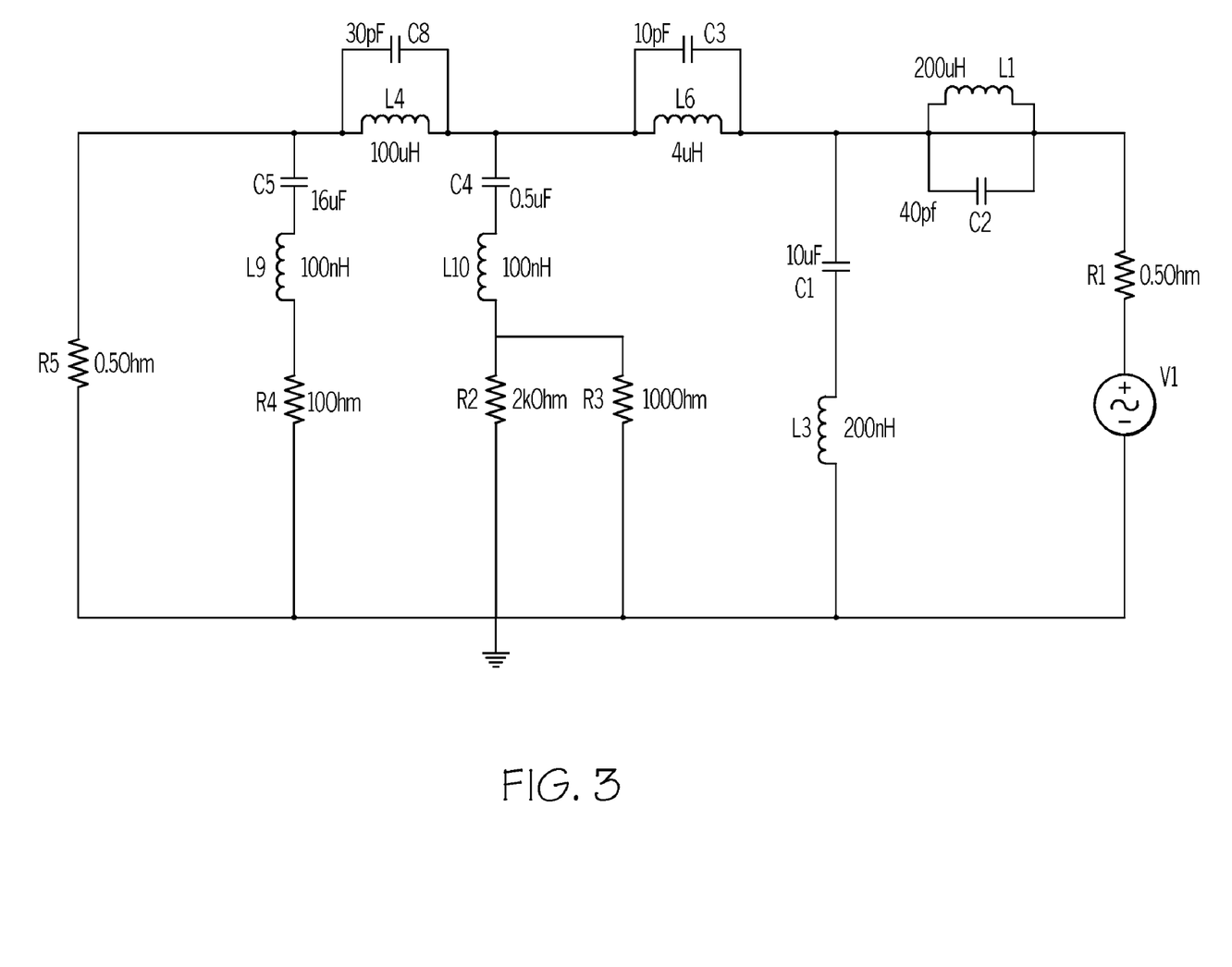
FIG. 3 is a schematic drawing of a ladder network circuit, equivalent to the circuit of FIG. 2, for simulation of passive differential made power line filtering, showing nominal expected component parasitic capacitances and inductances, according to a comparative example of the present invention.

Referring now to FIG. 3, for circuit simulation purposes, the circuit of FIGS. 1 and 2 were reconfigured, by methods known in the art, to a ladder network format. Nominal expected component parasitic capacitances and inductances are shown in FIG. 3.

Figure 4:
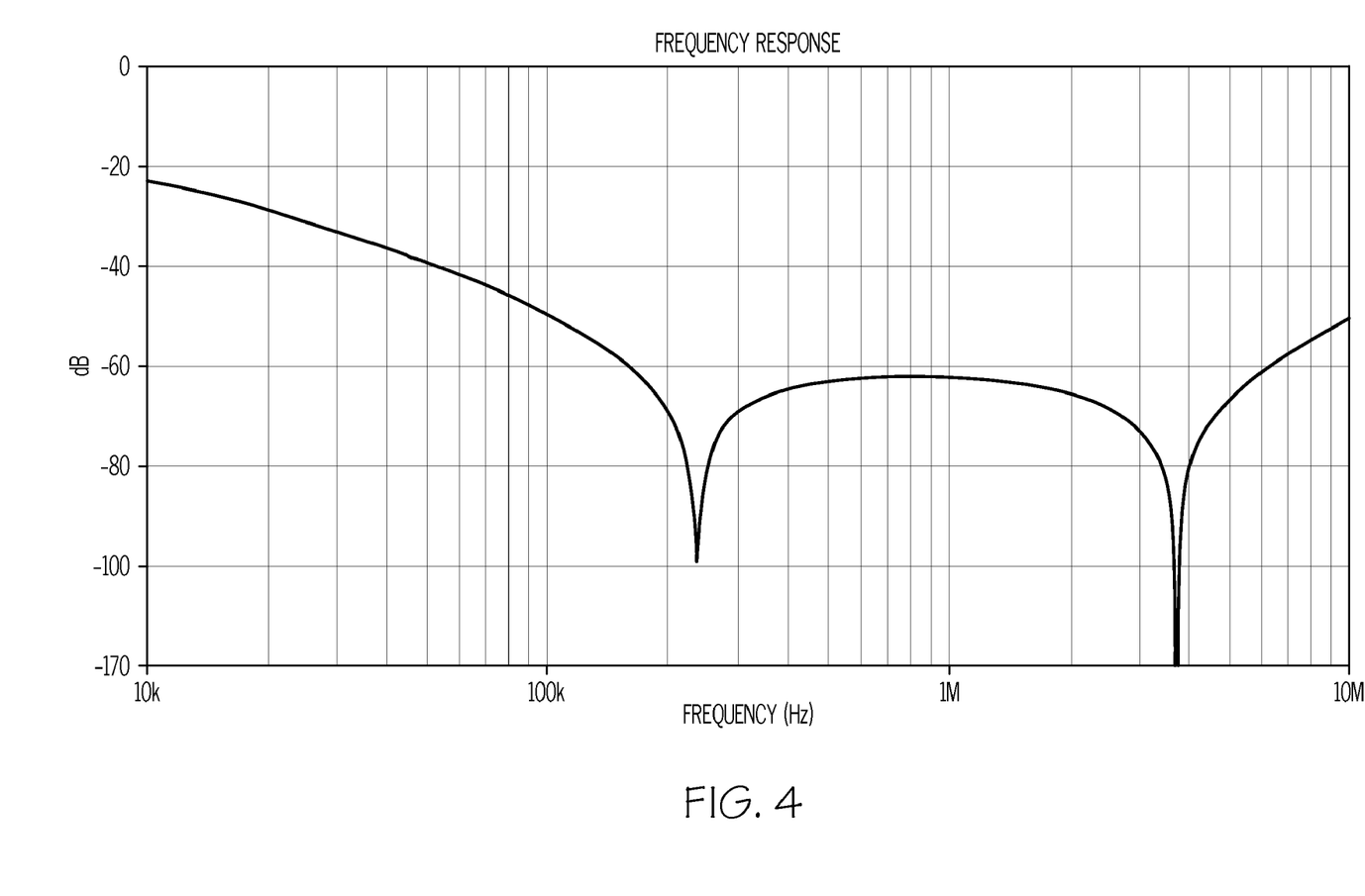
FIG. 4 is a graph showing the performance results of the circuit simulation of FIG. 3.

Referring to FIG. 4, the circuit simulation frequency response results of the ladder network equivalent passive differential mode filter circuit of FIG. 3 is shown. The graph shows the frequency response in decibels (dB) over a frequency of 10 kHz to 10 MHz. The resonances due to nominal expected parasitic reactances associated with the filter elements may be apparent, from FIG. 4, at about 236 kHz and 3.7 MHz.

COMPARATIVE EXAMPLE 2

Figure 5:
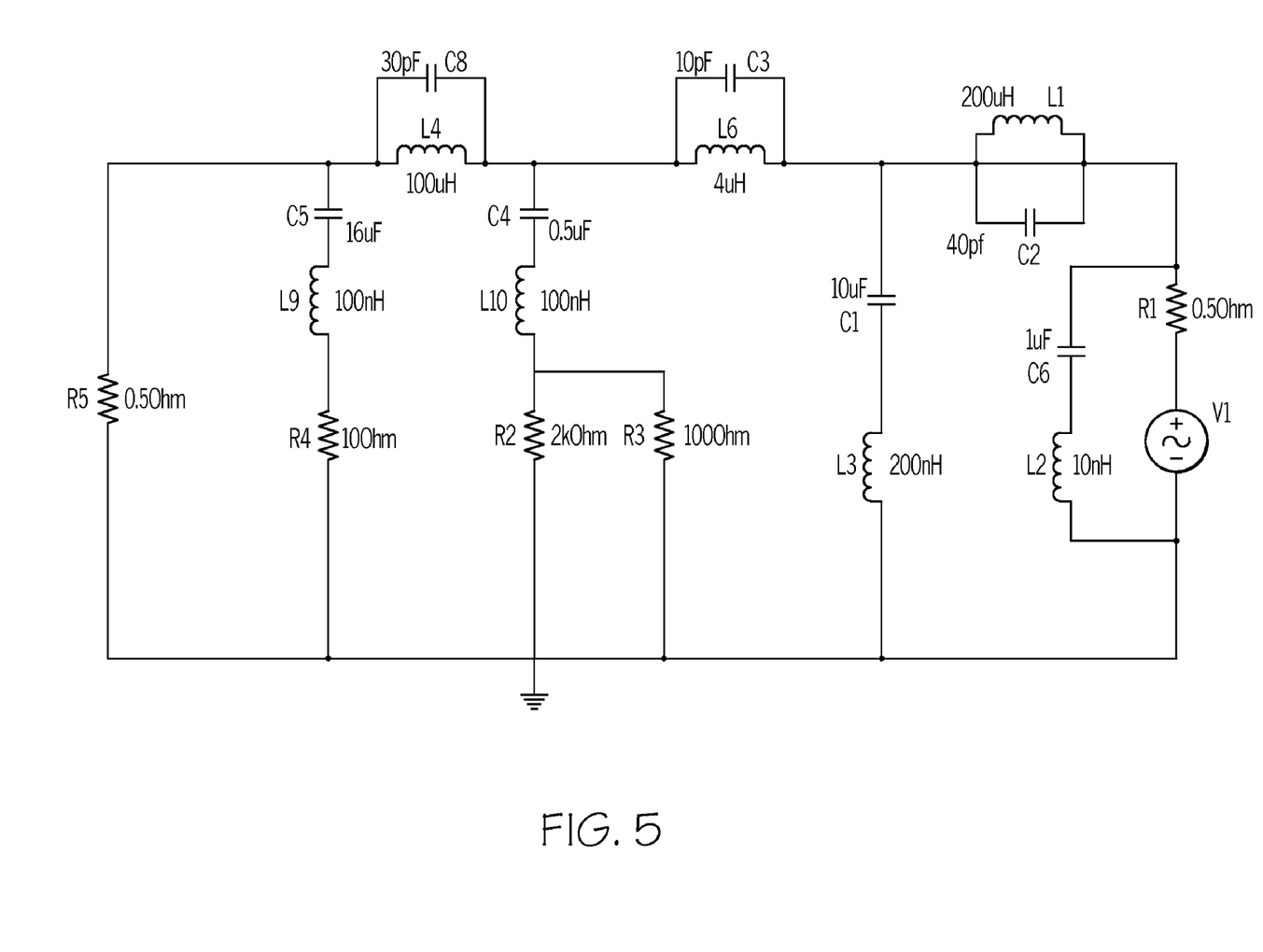
FIG. 5 is a schematic drawing of a ladder network circuit, similar to the circuit of FIG. 3, with an additional differential mode capacitor, according to a comparative example of the present invention.

One method for enhancing the effectiveness of passive differential mode filtering may be to place a differential mode suppression capacitor 50 across the interference source V1, as shown in FIG. 5. A parasitic lead inductance of 10 nanohenries (nH) may be assumed for the capacitor installation, as shown.

Figure 6:
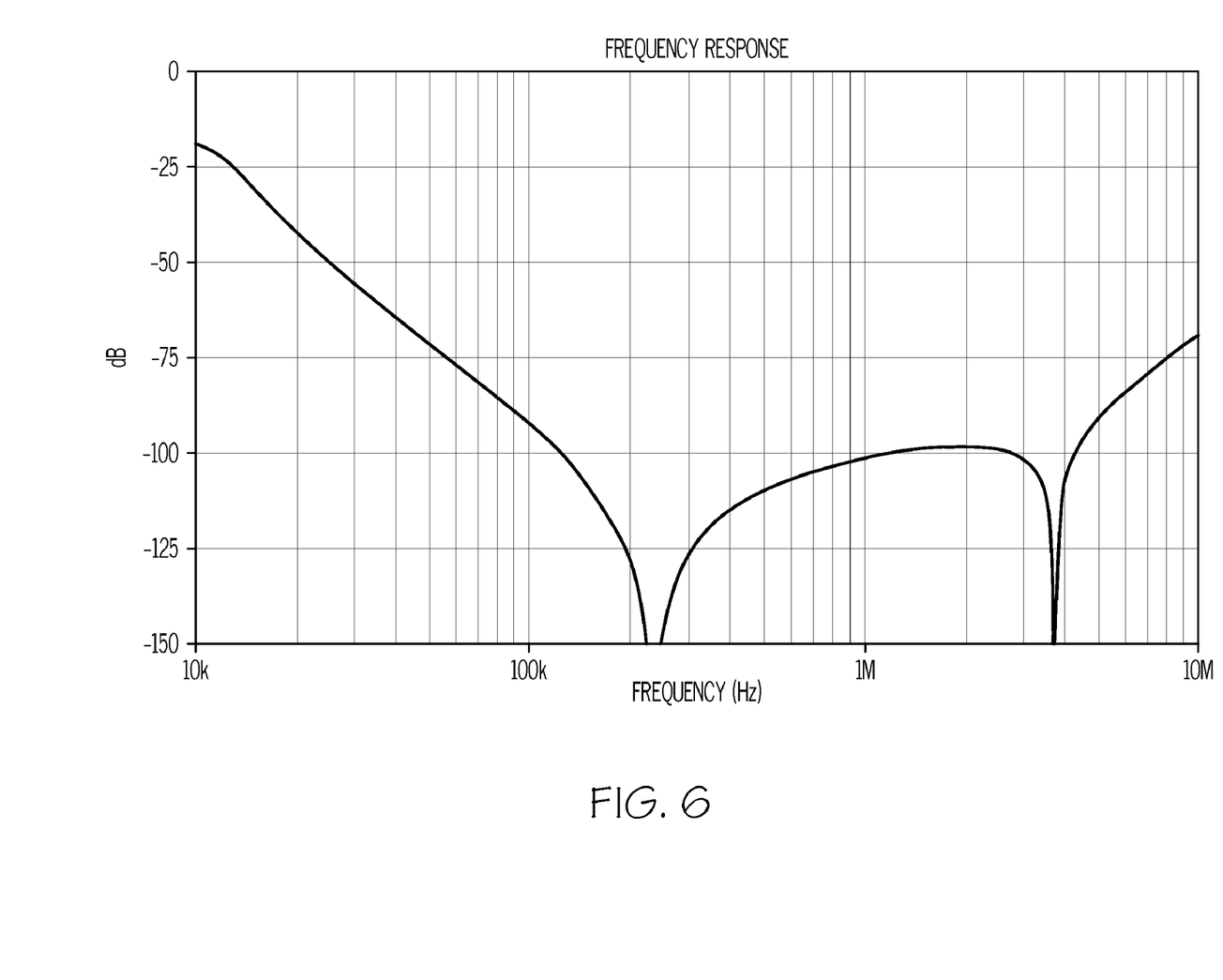
FIG. 6 is a graph showing the performance results of the circuit simulation of FIG. 5.

Referring to FIG. 6, the circuit simulation frequency response results of the ladder network equivalent passive differential mode filter circuit of FIG. 5 is shown. The graph shows the frequency response in decibels (dB) over a frequency of 10 kHz to 10 MHz. The resonances due to nominal expected parasitic reactances associated with the filter elements may be apparent, from FIG. 6, at about 236 kHz and 3.7 MHz.

EXAMPLE 1

Figure 7:
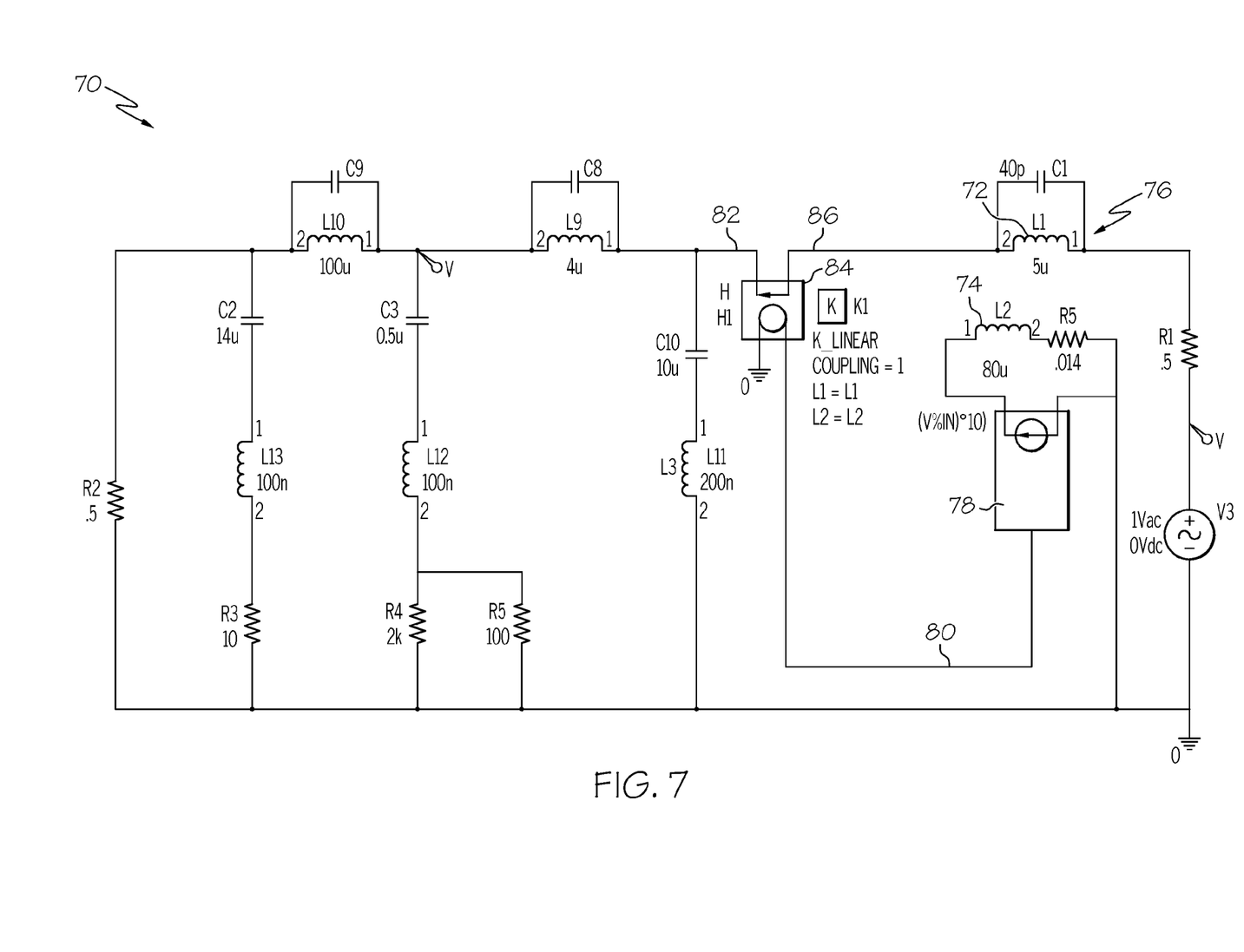
FIG. 7 is a schematic drawing of a ladder network circuit according to the present invention.

Referring now to FIG. 7, there is shown an equivalent ladder network circuit 70 used for simulation of active differential mode power line filtering, using an active filter 76, according to the present invention. The nominal expected component parasitic capacitances and inductances are shown in FIG. 7.

In the active filtering circuit, the inductor L1, which, in the Comparative Examples 1 and 2 above was a 200 μH coil, may be an inductor with a 5 μH main coil 72 and an 80 μH auxiliary coil 74 as shown in FIG. 7. In one embodiment of the present invention, the main coil 72 and the auxiliary coil 74 are wound on a single core. The active filtering circuit may include an amplifier and phase shifting block 78 for amplifying and phase shifting any main line harmonics (for example, an interference current) sensed by the current sensor 84. This current signal 80 may be amplified and phase shifted in block 78 and introduced back into the power lead 82 by transformer coupling at the main coil 72.

The interference sensed may be shifted in phase by the amplifier and phase change block 78 such that, when the signal 80 is added back into the power lead 82, by the transformer coupling of the auxiliary coil 74 with main coil 72, the resulting signal 86 may have a significantly reduced interference signal.

Figure 8:
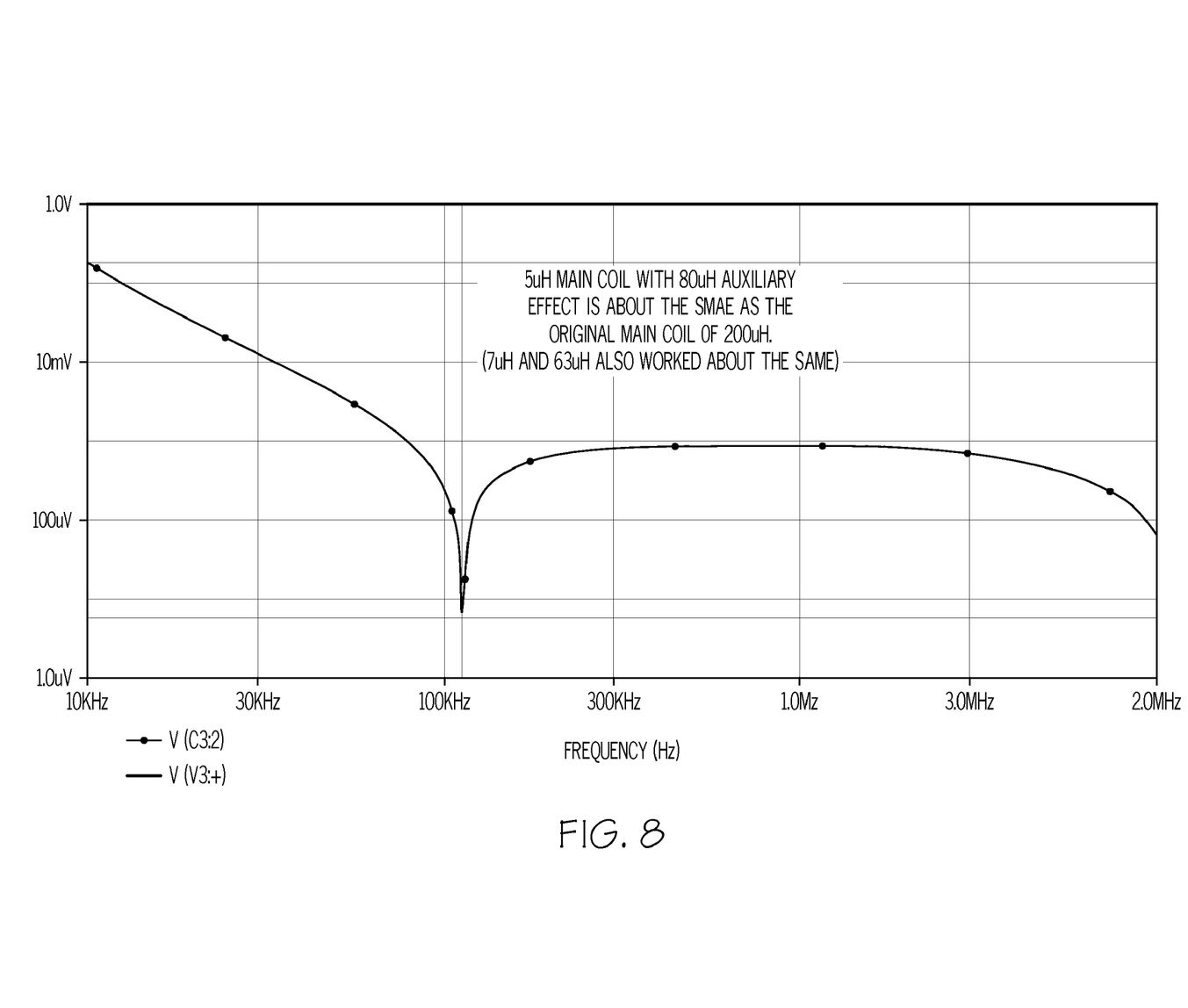
FIG. 8 is a graph showing the performance results of the circuit simulation of FIG. 7.

Referring to FIG. 8, the circuit simulation frequency response results of the ladder network equivalent active differential mode filter circuit of FIG. 7 are shown. The graph shows that the inductor having a 5 μH main coil and an 80 μH auxiliary coil may give approximately the same filtering as the passive filters of Comparative Examples 1 and 2, where a 200 μH inductor was used. Therefore, the present invention may provide a weight reduction from about 2 to about 6 times less than that of conventional systems, typically from about 3 to about 4 times less than that of the passive filtering of Comparative Examples 1 and 2.

While the present invention was described with respect to a specific active filter having a 5 μH main coil and an 80 μH auxiliary coil, other design parameters are considered within the scope of the present invention. For example, a 7 μH main coil and an 63 μH auxiliary coil may be used to give close to the same results of Example 1, thereby still reducing the power electronics' weight about 2 to about 6 times, compared to the passive filtering of Comparative Examples 1 and 2. A suitable range for the main coil may be from about 3 μH to about 20 μH, typically from about 5 μH to about 10 μH, while a suitable range for the auxiliary coil may be from about 20 μH to about 100 μH, typically from about 40 μH to about 80 μH.

Figure 9:
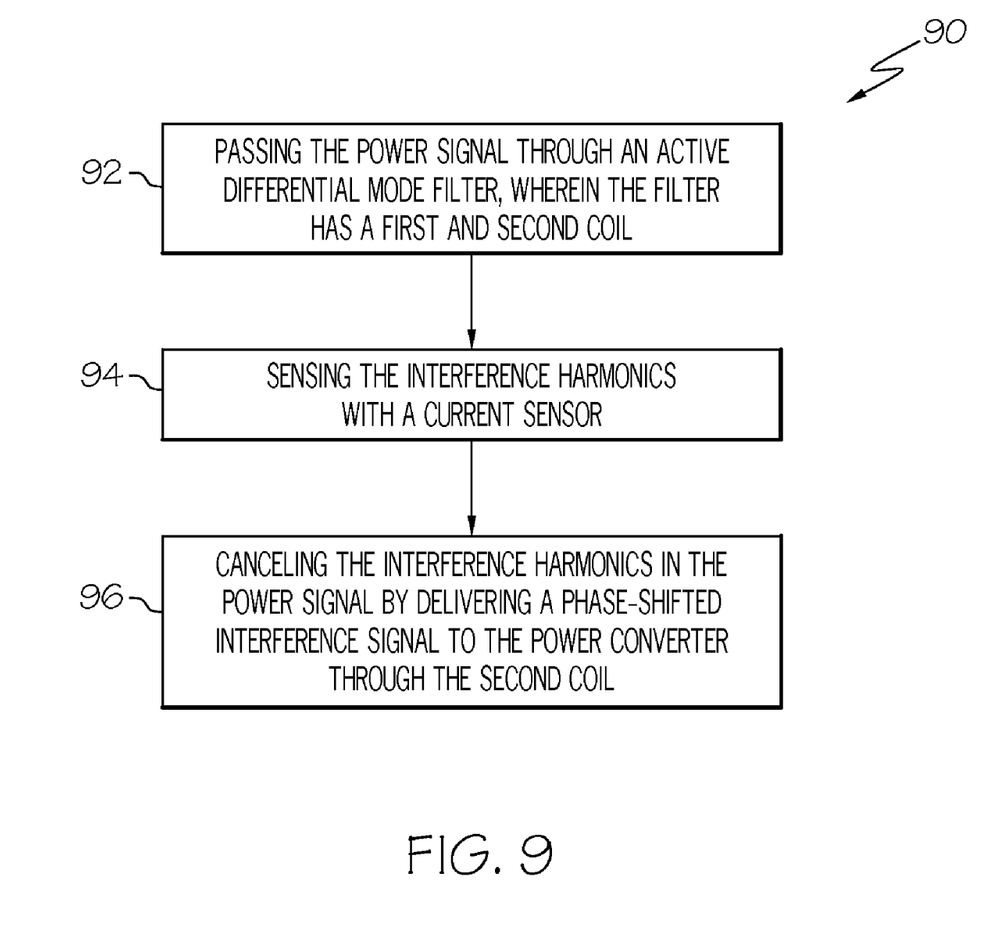
FIG. 9 is a flow chart describing a method according to the present invention.

Referring to FIG. 9, there is shown a flow chart of a method 90 for reducing interference current from a power signal (e.g., power signal 82). One step 92 of the method 90 may include passing the power signal through an active differential mode filter (e.g., the active filter described above under Example 1. A further step 94 may include amplifying and phase shifting any main line harmonics (for example, an interference current) sensed by the current sensor 84 sensing the interference current with one of the coils (e.g., auxiliary coil 74) of the active filter. A still further step 96 may include introducing the amplified and phase shifted current signal back into the power signal by transformer coupling at the main coil 72.

It should be understood, of course, that the foregoing relates to exemplary embodiments of the invention and that modifications may be made without departing from the spirit and scope of the invention as set forth in the following claims.

We claim:

1. A circuit for filtering a power signal, the circuit comprising:
   an inductor having a main coil and an auxiliary coil, the main coil having a first winding and the auxiliary coil having a second winding; and
   a current sensor block sensing an interference current in the power signal, wherein
   a cancellation signal, based on the sensed interference current, is delivered to the auxiliary coil and added back into the power signal to cancel the interference current from the power signal by transformer coupling of the auxiliary coil with the main coil.

2. The circuit of claim 1, further comprising an amplifier and phase change block for amplifying a sensed interference current and shifting the phase thereof to give the cancellation signal.

3. The circuit of claim 1, wherein the first winding and the second winding are wound on a common core.

4. The circuit of claim 1, wherein the circuit is a portion of power electronics for a switching power converter.

5. The circuit of claim 1, wherein the weight and volume of the inductor are less than the weight and volume of an inductor used for conventional passive differential mode filtering.

6. A power converter producing harmonics impressed on a power signal, the power converter comprising an active differential mode filter, the filter comprising:

> first and second coils wound on a common core, wherein the first coil acts as a passive differential mode filter; and
>
> a current sensor block sensing harmonics as an interference current on the power signal; wherein
>
> the second coil adds a cancellation signal, based on the interference current, back into the power signal by transformer coupling of the second coil to the first coil to cancel the harmonics from the power supply.

7. The power converter of claim 6, wherein the first coil has an inductance from about 5 µH to about 7 µH and the second coil has an inductance from about 63 µH to about 80 µH.

8. The power converter of claim 7, wherein the weight and volume of the inductor are less than the weight and volume of an inductor used for conventional passive differential mode filtering.

9. The power converter of claim 6, further comprising an amplifier and phase change block for amplifying the interference current and shifting the phase thereof to give the cancellation signal.

10. A method for reducing interference harmonics from a power converter, the method comprising:

> passing a power signal through an active differential mode filter having first and second coils;
>
> sensing the interference harmonics with a sensing device; and
>
> canceling the interference harmonics in the power signal by delivering a phase-shifted interference signal to the second coil which is added back into the power signal by transformer coupling of the second coil with the first coil.

11. The method of claim 10, wherein the interference harmonics are interference currents.

12. The method of claim 10, further comprising actively and passively filtering the power signal with the first coil.

13. The method of claim 10, further comprising amplifying the sensed interference harmonics.

14. The method of claim 10, further comprising amplifying the sensed interference harmonics and shifting the phase thereof in an amplifier and phase change block to give the phase-shifted interference signal.

15. The method of claim 10, wherein the first coil and the second coil are wound on a common core.

* * * * *